US010804023B2

(12) United States Patent
Pal et al.

(10) Patent No.: US 10,804,023 B2
(45) Date of Patent: Oct. 13, 2020

(54) INTEGRATED INDUCTOR WINDINGS AND HEAT PIPES

(71) Applicant: Hamilton Sundstrand Corporation, Charlotte, NC (US)

(72) Inventors: Debabrata Pal, Hoffman Estates, IL (US); Harry H. Chai, Caledonia, IL (US); Dwight D. Schmitt, Rockford, IL (US); Frank Z. Feng, Loves Park, IL (US); Charles Shepard, DeKalb, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 176 days.

(21) Appl. No.: 15/380,057

(22) Filed: Dec. 15, 2016

(65) Prior Publication Data
US 2018/0174732 A1    Jun. 21, 2018

(51) Int. Cl.
H01F 27/10 (2006.01)
H05K 3/32 (2006.01)
H05K 1/18 (2006.01)
H05K 7/20 (2006.01)
H01F 27/02 (2006.01)
H01F 41/04 (2006.01)
H01F 27/18 (2006.01)
(Continued)

(52) U.S. Cl.
CPC .......... H01F 27/10 (2013.01); H01F 27/022 (2013.01); H01F 27/18 (2013.01); H01F 27/2876 (2013.01); H01F 27/29 (2013.01); H01F 27/30 (2013.01); H01F 30/16 (2013.01); H01F 41/04 (2013.01); H05K 1/18 (2013.01); H05K 3/325 (2013.01); H05K 7/2039 (2013.01); H05K 7/20336 (2013.01); *H01F 27/2895* (2013.01);
(Continued)

(58) Field of Classification Search
CPC .............................. H01F 27/00–40; H01F 5/00
USPC ............ 336/55–62, 200, 220–223, 225, 229
See application file for complete search history.

(56) References Cited

U.S. PATENT DOCUMENTS 6,583,705 B2 * 6/2003 Schutten ............. H01F 27/2804
336/200
7,271,697 B2 * 9/2007 Whittaker ........... H01F 17/0033
336/229
(Continued)

FOREIGN PATENT DOCUMENTS

DE      19814896 A1    7/1999
EP       2144259 A2    1/2010
(Continued)

OTHER PUBLICATIONS

Extended European Search Report, issued in corresponding European Patent Application No. 17207653.1, dated May 14, 2018.

*Primary Examiner* — Tuyen T Nguyen
(74) *Attorney, Agent, or Firm* — Locke Lord LLP; Joshua L. Jones; Scott D. Wofsy

(57) ABSTRACT

An inductor includes a printed wiring board (PWB) and a plurality of electrically-conductive heat pipes operatively connected to the PWB. The PWB includes electrically conductive traces electrically connected to the plurality of electrically-conductive heat pipes. The traces and plurality of electrically conductive heat pipes form an inductor winding. A method of manufacturing an inductor includes mounting a plurality of electrically conductive heat pipes to a printed wiring board (PWB), wherein the PWB includes electrically conductive traces to connect the plurality of electrically-conductive heat pipes to form an inductor winding.

10 Claims, 5 Drawing Sheets

(51) Int. Cl.
    *H01F 27/28*     (2006.01)
    *H01F 30/16*     (2006.01)
    *H01F 27/29*     (2006.01)
    *H01F 27/30*     (2006.01)

(52) U.S. Cl.
    CPC ............... *H01F 2027/2814* (2013.01); *H05K 2201/1003* (2013.01)

(56) References Cited

U.S. PATENT DOCUMENTS

| | | | |
|---|---|---|---|
| 7,352,270 | B1 | 4/2008 | Copeland |
| 7,489,226 | B1 * | 2/2009 | Chignola ............ H01F 27/2804 336/229 |
| 7,889,501 | B2 * | 2/2011 | Shioiri ................... H01F 27/06 165/80.3 |
| 8,125,777 | B1 * | 2/2012 | MacLennan ............ H01F 27/10 310/208 |
| 9,312,059 | B2 * | 4/2016 | Dinh ........................ H01F 17/06 |
| 9,743,523 | B2 * | 8/2017 | Huang ................ H01F 27/2804 |
| 10,410,782 | B2 * | 9/2019 | Otsubo .............. H01F 17/0033 |
| 2016/0120066 | A1 | 4/2016 | Andres et al. |

FOREIGN PATENT DOCUMENTS

| | | | |
|---|---|---|---|
| JP | S5914618 A | | 1/1984 |
| JP | 01318220 A | * | 12/1989 |
| JP | 04337610 A | * | 11/1992 |

\* cited by examiner

INTEGRATED INDUCTOR WINDINGS AND HEAT PIPES

BACKGROUND OF THE INVENTION

1. Field of the Invention

The present disclosure relates to heat transfer in inductor windings, and more particularly to heat pipes in inductor windings.

2. Description of Related Art

It is known that electrical power systems, and specifically inductor windings, power inverters, and interphase transformers in the power systems, generate waste heat during their operation. This heat, if not properly managed, can result in electrical component failure, leading to frequent repair and replacement of the electronic components.

For example, typical systems for removing heat from an interphase transformer have employed fans as well as vents which blow air or other gasses over the electronic components, thereby cooling them. Another solution used in some three-phase interphase transformer systems involves a physical heat sink which draws the heat away from the interphase transformer and allows the heat to dissipate. Such a system can use water cooling, gas cooling, or other systems known in the art to cool the heat sink and facilitate the dissipation of heat. One known system using this solution draws heat away from the three-phase interphase inverter by using water cooled heat sinks. The three-phase interphase transformer has one phase attached to each phase of the three-phase power inverter. The heat sinks communicate the heat from the three-phase inverter and the interphase transformer away from the core and the windings. The heat sink is then cooled using either gas or liquid cooling.

The conventional techniques have been considered satisfactory for their intended purpose. However, there is an ever present need for improved heat transfer in electrical power systems such as inductors, power inverters, interphase transformers, and the like. This disclosure provides a solution for this problem.

SUMMARY OF THE INVENTION

An inductor includes a printed wiring board (PWB) and a plurality of electrically-conductive heat pipes operatively connected to the PWB. The PWB includes electrically conductive traces electrically connected to the plurality of electrically-conductive heat pipes. The traces and plurality of electrically conductive heat pipes form an inductor winding.

The inductor winding can wind around an annular inductor core. Each of the heat pipes in the plurality of electrically-conductive heat pipes can include a u-shaped tubular member that is electrically conductive, with a phase change material housed within the u-shaped tubular member. Each of the heat pipes of the plurality of electrically conductive heat pipes has both ends thereof press fitted into the PWB. Each of the electrically conductive traces can be defined in multiple layers of the PWB.

A housing can be included in thermal communication with the PWB and the plurality of electrically-conductive heat pipes. A cold plate can be included in thermal communication with the PWB to receive heat therefrom. The cold plate can be mounted to the housing on a side of the housing opposite the PWB. It is also contemplated that a finned heat sink can be included in thermal communication with the housing to receive heat therefrom. The finned heat sink can be mounted to the housing on a common side of the housing with the PWB. A potting material can fill in space between the housing and the PWB and the plurality of electrically-conductive heat pipes.

A method of manufacturing an inductor includes mounting a plurality of electrically conductive heat pipes to a printed wiring board (PWB), wherein the PWB includes electrically conductive traces to connect the plurality of electrically-conductive heat pipes to form an inductor winding. Mounting can include press fitting the plurality of electrically conductive heat pipes into the PWB by press fitting both ends of each heat pipe of the plurality of electrically conductive heat pipes into the PWB, wherein each heat pipe of the plurality of heat pipes is u-shaped. The method can include mounting a housing to the PWB and to the plurality of electrically-conductive heat pipes with potting material filling space between the housing and the PWB and the plurality of electrically-conductive heat pipes. It is also contemplated that the method can include mounting at least one of a finned heat sink or a cold plate to the housing.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
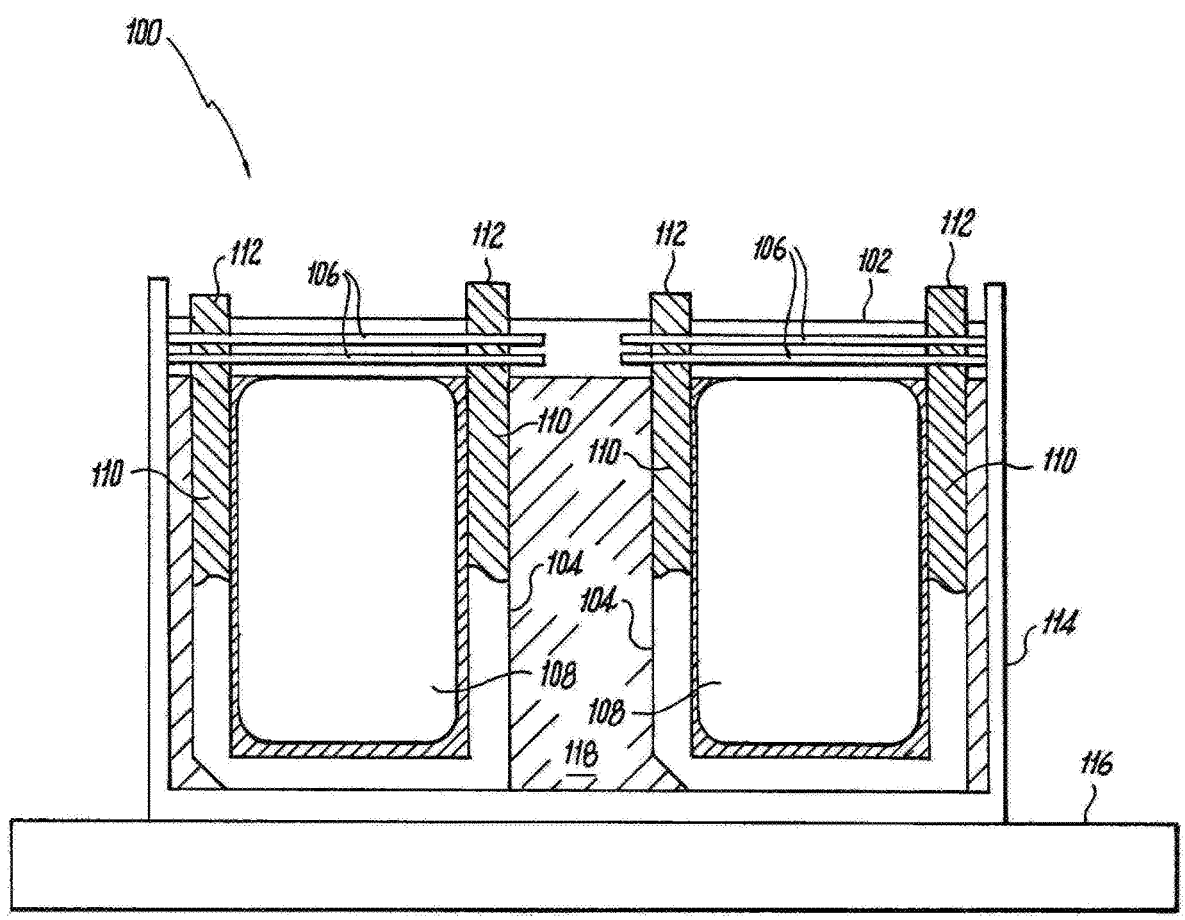
FIG. 1 is a schematic cross-sectional side elevation view of an exemplary embodiment of an inductor constructed in accordance with the present disclosure, showing two of the heat pipes.

Reference will now be made to the drawings wherein like reference numerals identify similar structural features or aspects of the subject disclosure. For purposes of explanation and illustration, and not limitation, a partial view of an exemplary embodiment of an inductor in accordance with the disclosure is shown in FIG. 1 and is designated generally by reference character 100. Other embodiments of inductors in accordance with the disclosure, or aspects thereof, are provided in FIGS. 2-6, as will be described. The systems and methods described herein can be used for effective heat transfer in inductors.

Figure 2:
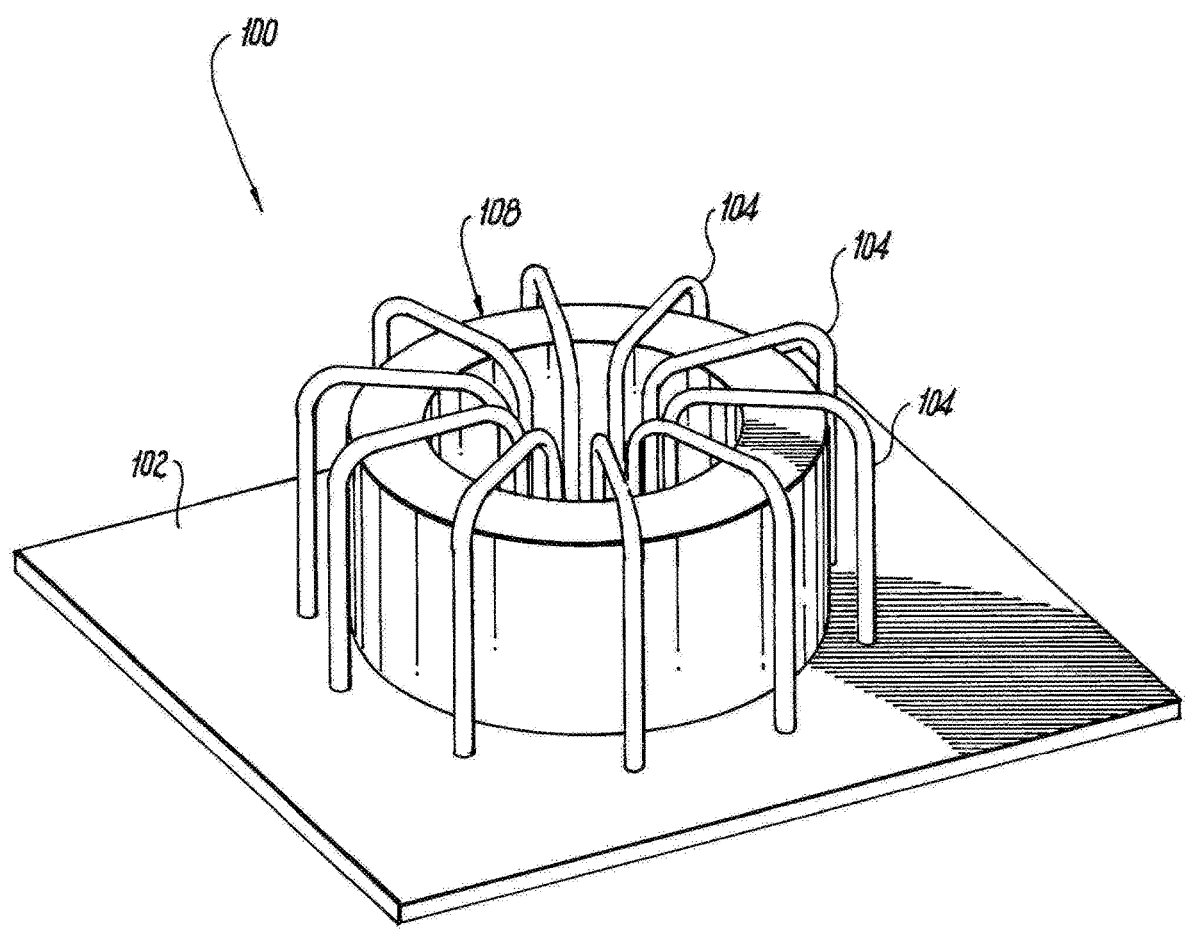
FIG. 2 is a perspective view of the inductor of FIG. 1, showing the inductor core with the housing removed.
Figure 3:
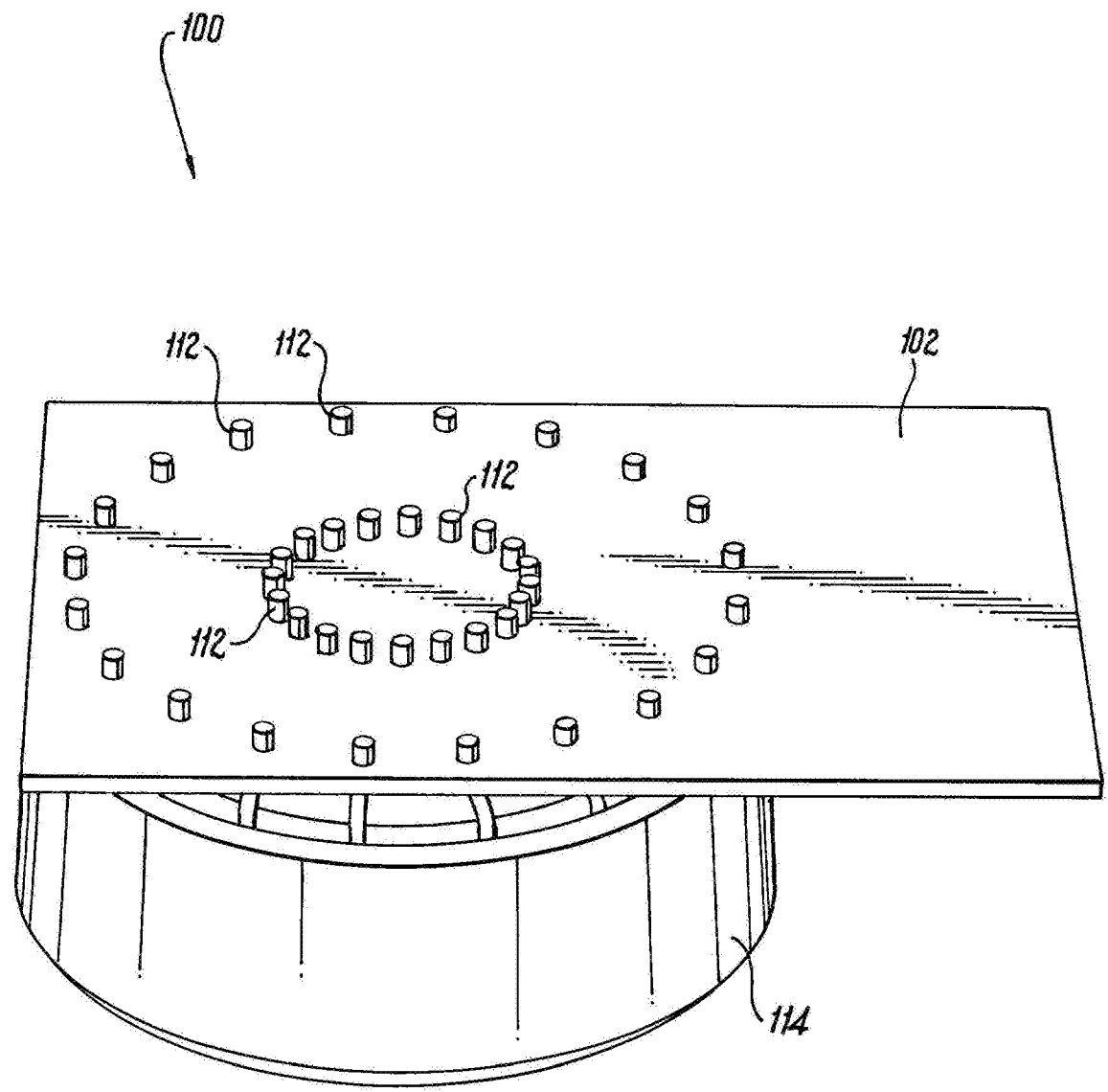
FIG. 3 is a perspective view of the inductor of FIG. 1, showing the press fit ends of the heat pipes protruding from the printed wiring board (PWB)

An inductor 100 includes a printed wiring board (PWB) 102 and a plurality of electrically-conductive heat pipes 104 operatively connected to the PWB 102. The PWB 102 includes electrically conductive traces 106 electrically connected to the plurality of electrically-conductive heat pipes 104. The traces 106 and plurality of electrically conductive heat pipes 104 form an inductor winding that winds around an annular inductor core 108. As shown in FIG. 2, each of the heat pipes 104 includes a u-shaped tubular member that is electrically conductive, with a phase change material 110 housed within the u-shaped tubular member. FIG. 2 shows how the heat pipes 104 are circumferentially spaced apart from one another. As shown in FIG. 3, each of the heat pipes 104 of the plurality of electrically conductive heat pipes has both ends 112 thereof press fitted into the PWB 102.

Figure 4:
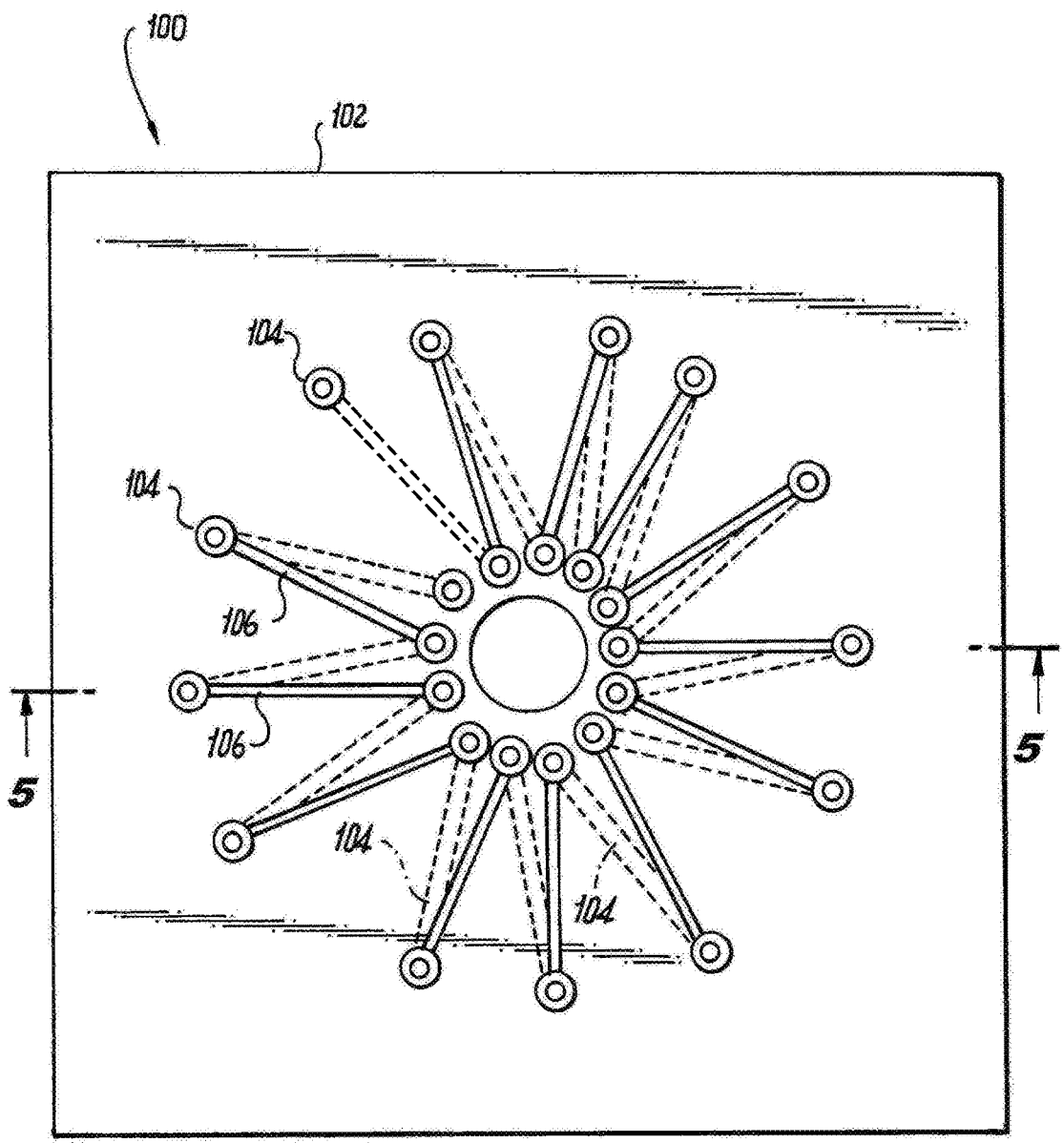
FIG. 4 is a schematic plan view of the PWB of FIG. 1, showing the traces for connecting the heat pipes to form an inductor winding.
Figure 5:
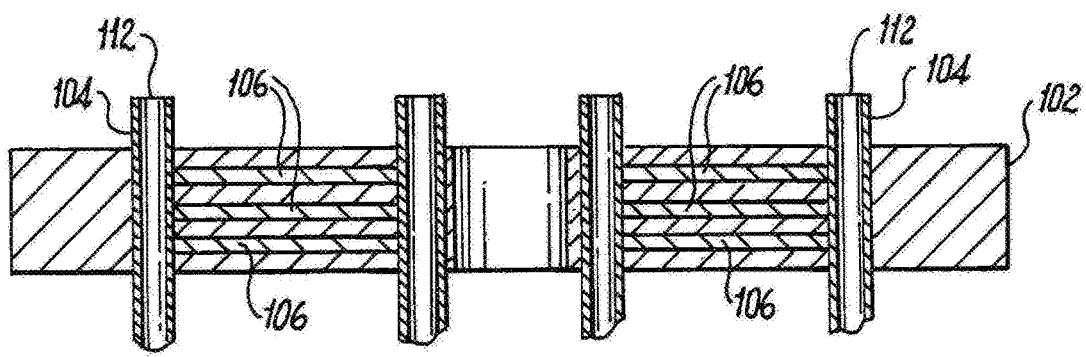
FIG. 5 is a schematic cross-sectional side elevation view of the PWB of FIG. 4, showing the traces within multiple layers of the PWB.

With reference again to FIG. 1, each of the electrically conductive traces 106 can be defined in multiple layers of the PWB 102. In FIG. 1, each trace 106 is in two layers of the PWB 102, however in FIG. 5 another example is shown with three layers for each trace 106 in PWB 102, and the traces can be in any suitable number of layers in the PWB 102 for a given application. FIG. 4 schematically shows the pattern of traces 106 with heat pipes 104 indicated with broken lines to show how traces 106 electrically connect heat pipes 104 into a single inductor coil.

Figure 6:
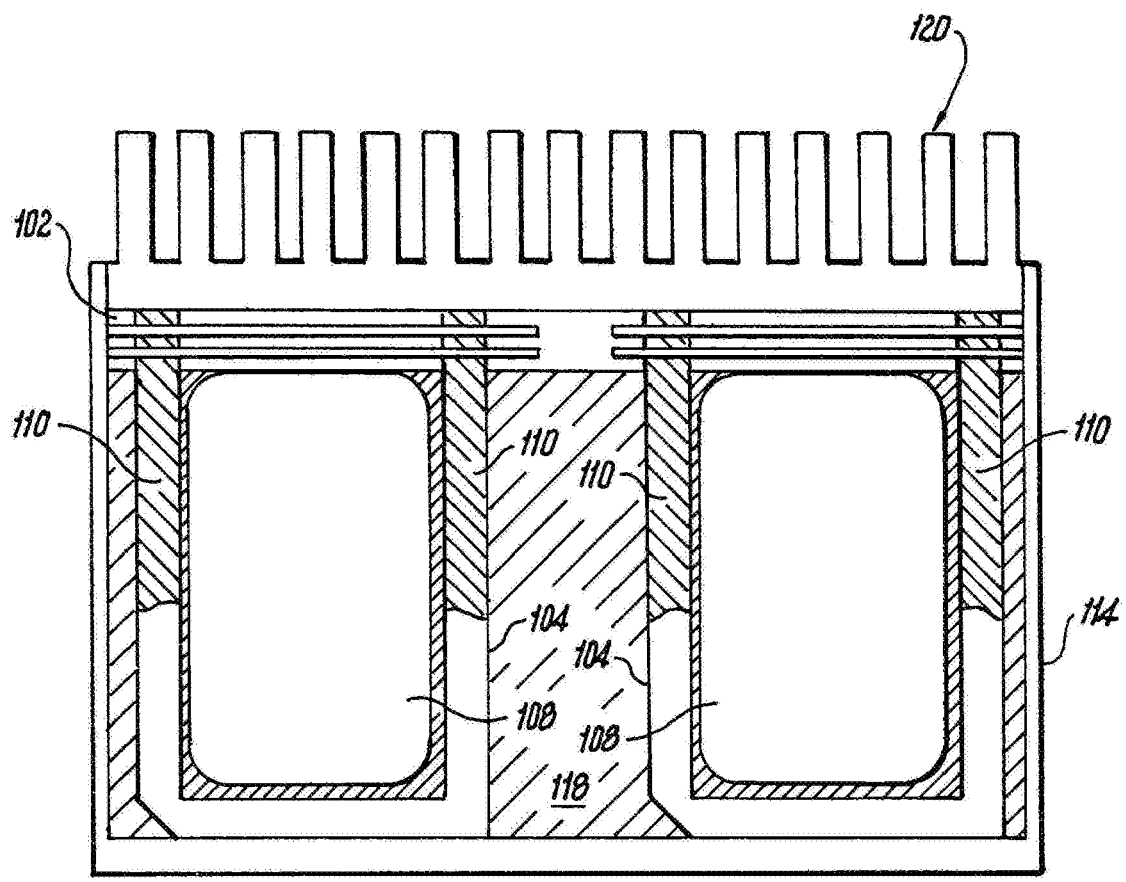
FIG. 6 is a schematic cross-sectional side elevation view of the inductor of FIG. 1, with a finned heat sink in lieu of the cold plate.

With continued reference to FIG. 1, a housing 114 is included in thermal communication with the PWB 102 and the plurality of electrically-conductive heat pipes 104. A cold plate 116 is included in thermal communication with the PWB 102 to receive heat therefrom. The cold plate 116 is mounted to the housing 114 on a side of the housing 114 opposite the PWB 102. A potting material 118 fills in space between the housing 114, the PWB 102, the plurality of electrically-conductive heat pipes 104, and core 108, e.g., to facilitate heat transfer from PWB 102 and heat pipes 104. As shown in FIG. 6, a finned heat sink 120 can be included, e.g in addition to or in lieu of cold plate 116, in thermal communication with the PWB 102 to receive heat therefrom. The finned heat sink 120 can be mounted to the housing 114 on a common side of the housing 114 with the PWB 102, e.g., in intimate thermal contact with PWB 102.

A method of manufacturing an inductor, e.g., inductor 100, includes mounting a plurality of electrically conductive heat pipes, e.g., heat pipes 104, to a printed wiring board (PWB), e.g. PWB 102, wherein the PWB includes electrically conductive traces, e.g., traces 106, to connect the plurality of electrically-conductive heat pipes to form an inductor winding. Mounting can include press fitting the plurality of electrically conductive heat pipes into the PWB by press fitting both ends, e.g., ends 112, of each heat pipe of the plurality of electrically conductive heat pipes into the PWB, wherein each heat pipe of the plurality of heat pipes is u-shaped. In another embodiment, heat pipes can be soldered to the PWB plated through hole, forming electrical connection between heat pipe and PWB. The method can include mounting a housing, e.g., housing 114, to the PWB and to the plurality of electrically-conductive heat pipes with potting material, e.g., potting material 118, filling space between the housing and the PWB and the plurality of electrically-conductive heat pipes. In this manner, two-phase cooling using heat pipe is more simplified, and small amount of coolant is required. It is also contemplated that the method can include mounting at least one of a finned heat sink, e.g., finned heat sink 120 or a cold plate, e.g., cold plate 116, to the housing. Each heat pipe 104 has small amount of liquid in it and a wick structure disposed on the inside radius of the heat pipe wall. The outer pipe portion surrounding the inside radius is used for conduction of electrical current. During operation liquid inside evaporates at the end, e.g. furthest from the cold plate 116, and evaporated vapor moves through the core of the heat pipe 104 to the end, e.g., proximate to the cold plate 116. Vapor condenses near the cold plate portion of the heat pipe and flows through the wick to the end opposite to the cold plate. This evaporation-condensation mechanism provides higher heat transfer rate and effective conductivity of heat pipe 104 is thus much higher (e.g., 2-10 times) than that of conventional heat pipe tubes of solid Aluminum or Copper.

As an example, in high frequency motor operation, in the transformer or inductor winding skin depth is small, hence the entire cross-section of an inductor winding is not necessarily needed for current flow. A hollow conductor, e.g., heat pipes 104, can be used to form a partial winding, e.g., with traces 106 which can be of copper or other suitable conductor. These traces are adequately sized to conduct current from the hollow heat pipes. Two-phase cooling can be used in small quantity to form an annular heat pipe cooling path around the core, e.g., core 108.

The methods and systems of the present disclosure, as described above and shown in the drawings, provide for inductors with superior properties including improved heat transfer for reduced inductor winding and core temperatures compared to conventional inductors, and for reduced complexity compared to conventional two-phase cooling arrangements for inductors. This can also provide for a simplified inductor housing, and reduced weight of potting compound compared to conventional arrangements. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An inductor comprising:
   a printed wiring board (PWB); and
   a plurality of electrically-conductive heat pipes operatively connected to the PWB, wherein the PWB includes electrically conductive traces electrically connected to the plurality of electrically-conductive heat pipes so the traces and plurality of electrically conductive heat pipes form an inductor winding, wherein each of the electrically conductive traces has multiple portions, wherein each portion of the trace is defined in a different one of multiple layers of the PWB, wherein each portion of the trace connects in parallel with the other portion or portions of the trace to the same two heat pipe ends.

2. The inductor as recited in claim 1, further comprising an annular inductor core, wherein the inductor winding winds around the annular inductor core.

3. The inductor as recited in claim 1, wherein each of the heat pipes in the plurality of electrically-conductive heat pipes includes a u-shaped tubular member that is electrically conductive, with a phase change material housed within the u-shaped tubular member.

4. The inductor as recited in claim 1, wherein each of the heat pipes of the plurality of electrically conductive heat pipes has both ends thereof press fitted into the PWB.

5. The inductor as recited in claim 1, further comprising a housing in thermal communication with the PWB and the plurality of electrically-conductive heat pipes.

6. The inductor as recited in claim 5, further comprising a cold plate in thermal communication with the PWB to receive heat therefrom.

7. The inductor as recited in claim 6, wherein the cold plate is mounted to the housing on a side of the housing opposite the PWB.

8. The inductor as recited in claim 5, further comprising a finned heat sink in thermal communication with the housing to receive heat therefrom.

9. The inductor as recited in claim 8, wherein the finned heat sink is mounted to the housing on a common side of the housing with the PWB.

10. The inductor as recited in claim 5, wherein a potting material fills in space between the housing and the PWB and the plurality of electrically-conductive heat pipes.

* * * * *